United States Patent
Wexler (10) Patent No.: US 8,425,287 B2
(45) Date of Patent: Apr. 23, 2013

(54) IN-ROW AIR CONTAINMENT AND COOLING SYSTEM AND METHOD

(75) Inventor: Peter Wexler, Barrington, RI (US)

(73) Assignee: Schneider Electric It Corporation, West Kingston, RI (US)

(*) Notice: Subject to any disclaimer, the term of this patent is extended or adjusted under 35 U.S.C. 154(b) by 1468 days.

(21) Appl. No.: 12/018,513

(22) Filed: Jan. 23, 2008

(65) Prior Publication Data

US 2008/0180908 A1 Jul. 31, 2008

Related U.S. Application Data

(60) Provisional application No. 60/881,969, filed on Jan. 23, 2007.

(51) Int. Cl.
*H05K 5/00* (2006.01)
*H05K 7/20* (2006.01)

(52) U.S. Cl.
USPC .......................................... 454/184; 361/690

(58) Field of Classification Search .................. 454/184; 361/690, 679.01
See application file for complete search history.

(56) References Cited

U.S. PATENT DOCUMENTS

| | | | |
|---|---|---|---|
| 1,025,243 A | 5/1912 | Carpenter et al. |
| 1,941,258 A | 12/1933 | Gordon |
| 2,455,022 A | 11/1948 | Schmidt |
| 3,317,798 A | 5/1967 | Chu et al. |
| 3,559,728 A | 2/1971 | Lyman et al. |
| 3,643,007 A | 2/1972 | Roberts et al. |
| 3,681,936 A | 8/1972 | Park |
| 3,742,725 A | 7/1973 | Berger |
| 3,995,446 A | 12/1976 | Eubank |
| 4,055,053 A | 10/1977 | Elfving et al. |
| 4,127,008 A | 11/1978 | Tyree, Jr. |
| 4,197,716 A | 4/1980 | Nussbaum |
| 4,223,535 A | 9/1980 | Kumm |
| 4,275,570 A | 6/1981 | Szymaszek et al. |
| 4,285,205 A | 8/1981 | Martin et al. |

(Continued)

FOREIGN PATENT DOCUMENTS

| CN | 1485906 A | 3/2004 |
|---|---|---|
| CN | 2612211 Y | 4/2004 |

(Continued)

OTHER PUBLICATIONS

"Essential Cooling System Requirements for Next Generation Data Centers," White Paper #5, Revision 3, 2003 American Power Conversion, Rev 2002-3, pp. 1-10.

(Continued)

*Primary Examiner* — Steven B McAllister
*Assistant Examiner* — Frances H Kamps
(74) *Attorney, Agent, or Firm* — Lando & Anastasi, LLP (57) ABSTRACT

An in-row electronic equipment storage system and corresponding method provides cooling to an electronic equipment rack. The system includes an electronic equipment rack that includes a housing adapted to receive electronic equipment, and an electronic equipment rack air cavity. A cooling rack, including a housing adapted to receive cooling equipment, and a cooling rack air cavity, is configured to be disposed adjacent to the electronic equipment rack. An interface allows for fluid communication between the cooling rack air cavity and the electronic equipment air cavity. The interface may include dampers to control air flow between the air cavities.

7 Claims, 5 Drawing Sheets

U.S. PATENT DOCUMENTS

| | | |
|---|---|---|
| 4,419,865 A | 12/1983 | Szymaszek |
| 4,502,609 A * | 3/1985 | Christatos ..................... 220/3.8 |
| 4,515,746 A | 5/1985 | Brun et al. |
| 4,590,538 A | 5/1986 | Cray, Jr. |
| 4,599,873 A | 7/1986 | Hyde |
| 4,696,168 A | 9/1987 | Woods et al. |
| 4,718,249 A | 1/1988 | Hanson |
| 4,747,041 A | 5/1988 | Engel et al. |
| 4,774,631 A | 9/1988 | Okuyama et al. |
| 4,823,247 A | 4/1989 | Tamoto |
| 4,823,290 A | 4/1989 | Fasack et al. |
| 4,827,151 A | 5/1989 | Okado |
| 4,827,733 A | 5/1989 | Dinh |
| 4,831,508 A | 5/1989 | Hunter |
| 4,837,663 A | 6/1989 | Zushi et al. |
| 4,911,231 A | 3/1990 | Horne et al. |
| 4,937,505 A | 6/1990 | Deglon et al. |
| 4,944,158 A | 7/1990 | Akiike et al. |
| 4,962,734 A | 10/1990 | Jorgensen |
| 4,980,812 A | 12/1990 | Johnson, Jr. et al. |
| 5,017,800 A | 5/1991 | Divan |
| 5,019,717 A | 5/1991 | McCurry et al. |
| 5,057,968 A | 10/1991 | Morrison |
| 5,095,712 A | 3/1992 | Narreau |
| 5,097,328 A | 3/1992 | Boyette |
| 5,126,585 A | 6/1992 | Boys |
| 5,150,580 A | 9/1992 | Hyde |
| 5,153,837 A | 10/1992 | Shaffer et al. |
| 5,158,132 A | 10/1992 | Guillemot |
| 5,168,724 A | 12/1992 | Gilbertson et al. |
| 5,173,819 A | 12/1992 | Takahashi et al. |
| 5,177,666 A | 1/1993 | Bland et al. |
| 5,181,653 A | 1/1993 | Foster et al. |
| 5,195,706 A | 3/1993 | Allen |
| 5,216,623 A | 6/1993 | Barrett et al. |
| 5,234,185 A | 8/1993 | Hoffman et al. |
| 5,269,372 A | 12/1993 | Chu et al. |
| 5,367,670 A | 11/1994 | Ward et al. |
| 5,381,554 A | 1/1995 | Langer et al. |
| 5,382,943 A | 1/1995 | Tanaka |
| 5,388,422 A | 2/1995 | Hayashida et al. |
| 5,404,136 A | 4/1995 | Marsden |
| 5,462,225 A | 10/1995 | Massara et al. |
| 5,507,529 A | 4/1996 | Martins |
| 5,519,306 A | 5/1996 | Itoh et al. |
| 5,528,507 A | 6/1996 | McNamara et al. |
| 5,533,357 A | 7/1996 | Voorhis |
| 5,572,873 A | 11/1996 | Lavigne et al. |
| 5,581,478 A | 12/1996 | Cruse et al. |
| 5,582,020 A | 12/1996 | Scaringe et al. |
| 5,649,428 A | 7/1997 | Calton et al. |
| 5,654,591 A | 8/1997 | Mabboux et al. |
| 5,657,641 A | 8/1997 | Cunningham et al. |
| 5,682,949 A | 11/1997 | Ratcliffe et al. |
| 5,684,686 A | 11/1997 | Reddy |
| 5,694,780 A | 12/1997 | Alsenz |
| 5,704,219 A | 1/1998 | Suzuki et al. |
| 5,718,628 A | 2/1998 | Nakazato et al. |
| 5,735,134 A | 4/1998 | Liu et al. |
| 5,749,237 A | 5/1998 | Sandofsky et al. |
| 5,794,897 A | 8/1998 | Jobin et al. |
| 5,802,856 A | 9/1998 | Schaper et al. |
| 5,845,090 A | 12/1998 | Collins, III et al. |
| 5,850,539 A | 12/1998 | Cook et al. |
| 5,860,012 A | 1/1999 | Luu |
| 5,860,280 A | 1/1999 | Recine, Sr. et al. |
| 5,896,922 A | 4/1999 | Chrysler et al. |
| 5,949,974 A | 9/1999 | Ewing et al. |
| 5,953,930 A | 9/1999 | Chu et al. |
| 5,954,127 A | 9/1999 | Chrysler et al. |
| 5,959,240 A | 9/1999 | Yoshida et al. |
| 5,960,204 A | 9/1999 | Yinger et al. |
| 5,963,425 A | 10/1999 | Chrysler et al. |
| 5,963,457 A | 10/1999 | Kanoi et al. |
| 5,970,731 A | 10/1999 | Hare et al. |
| 5,970,734 A | 10/1999 | Stillwell et al. |
| 5,972,196 A | 10/1999 | Murphy et al. |
| 5,974,237 A | 10/1999 | Shurmer et al. |
| 5,978,594 A | 11/1999 | Bonnell et al. |
| 5,978,912 A | 11/1999 | Rakavy et al. |
| 5,982,652 A | 11/1999 | Simonelli et al. |
| 5,984,144 A | 11/1999 | Wyatt |
| 5,987,614 A | 11/1999 | Mitchell et al. |
| 5,995,729 A | 11/1999 | Hirosawa et al. |
| 6,023,935 A | 2/2000 | Okazaki et al. |
| 6,032,472 A | 3/2000 | Heinrichs et al. |
| 6,034,872 A | 3/2000 | Chrysler et al. |
| 6,038,879 A | 3/2000 | Turcotte et al. |
| 6,055,480 A | 4/2000 | Nevo et al. |
| 6,085,243 A | 7/2000 | Fletcher et al. |
| 6,088,225 A * | 7/2000 | Parry et al. ..................... 361/704 |
| 6,104,868 A | 8/2000 | Peters et al. |
| 6,105,061 A | 8/2000 | Nakai |
| 6,108,782 A | 8/2000 | Fletcher et al. |
| 6,111,036 A | 8/2000 | Wonders et al. |
| 6,112,235 A | 8/2000 | Spofford |
| 6,134,511 A | 10/2000 | Subbarao |
| 6,141,762 A | 10/2000 | Nicol et al. |
| 6,189,109 B1 | 2/2001 | Sheikh et al. |
| 6,199,204 B1 | 3/2001 | Donohue |
| 6,208,510 B1 | 3/2001 | Trudeau et al. |
| 6,209,330 B1 | 4/2001 | Timmerman et al. |
| 6,213,194 B1 | 4/2001 | Chrysler et al. |
| 6,216,482 B1 | 4/2001 | Xiao et al. |
| 6,216,956 B1 * | 4/2001 | Ehlers et al. ..................... 236/47 |
| 6,223,810 B1 | 5/2001 | Chu et al. |
| 6,237,353 B1 | 5/2001 | Sishtla et al. |
| 6,246,969 B1 | 6/2001 | Sinclair et al. |
| 6,266,721 B1 | 7/2001 | Sheikh et al. |
| 6,276,161 B1 | 8/2001 | Peiffer et al. |
| 6,281,790 B1 | 8/2001 | Kimmel et al. |
| 6,305,180 B1 | 10/2001 | Miller et al. |
| 6,327,143 B1 | 12/2001 | Bonstrom et al. |
| 6,332,202 B1 | 12/2001 | Sheikh et al. |
| 6,332,335 B1 | 12/2001 | Kajimoto et al. |
| 6,347,627 B1 | 2/2002 | Frankie et al. |
| 6,363,421 B2 | 3/2002 | Barker et al. |
| 6,374,627 B1 | 4/2002 | Schumacher et al. |
| 6,381,700 B1 | 4/2002 | Yoshida |
| 6,389,464 B1 | 5/2002 | Krishnamurthy et al. |
| 6,415,628 B1 | 7/2002 | Ahmed et al. |
| 6,438,978 B1 | 8/2002 | Bessler |
| 6,457,076 B1 | 9/2002 | Cheng et al. |
| 6,459,579 B1 | 10/2002 | Farmer et al. |
| 6,474,087 B1 | 11/2002 | Lifson |
| 6,483,730 B2 | 11/2002 | Johnson, Jr. |
| 6,494,050 B2 | 12/2002 | Spinazzola et al. |
| 6,557,624 B1 | 5/2003 | Stahl et al. |
| 6,574,104 B2 | 6/2003 | Patel et al. |
| 6,575,234 B2 | 6/2003 | Nelson |
| 6,640,889 B1 | 11/2003 | Harte et al. |
| 6,661,678 B2 | 12/2003 | Raddi et al. |
| 6,662,576 B1 | 12/2003 | Bai |
| 6,668,565 B1 | 12/2003 | Johnson et al. |
| 6,672,955 B2 | 1/2004 | Charron |
| 6,682,100 B2 | 1/2004 | Wood et al. |
| 6,694,759 B1 | 2/2004 | Bash et al. |
| 6,695,577 B1 | 2/2004 | Susek |
| 6,714,977 B1 | 3/2004 | Fowler et al. |
| 6,718,277 B2 | 4/2004 | Sharma |
| 6,718,781 B2 | 4/2004 | Freund et al. |
| 6,721,672 B2 | 4/2004 | Spitaels et al. |
| 6,745,579 B2 | 6/2004 | Spinazzola et al. |
| 6,745,590 B1 | 6/2004 | Johnson et al. |
| 6,761,212 B2 | 7/2004 | DiPaolo |
| 6,775,137 B2 | 8/2004 | Chu et al. |
| 6,795,928 B2 | 9/2004 | Bradley et al. |
| 6,804,616 B2 | 10/2004 | Bodas |
| 6,804,975 B2 | 10/2004 | Park |
| 6,814,134 B1 | 11/2004 | Pravda |
| 6,819,563 B1 * | 11/2004 | Chu et al. ..................... 361/696 |
| 6,827,142 B2 | 12/2004 | Winkler et al. |
| 6,829,630 B1 | 12/2004 | Pajak et al. |
| 6,832,504 B1 | 12/2004 | Birkmann |
| 6,848,989 B2 | 2/2005 | Miyazaki et al. |
| 6,859,366 B2 | 2/2005 | Fink |
| 6,859,882 B2 | 2/2005 | Fung |

| Patent No. | Date | Inventor |
|---|---|---|
| 6,862,179 B2 | 3/2005 | Beitelmal et al. |
| 6,876,549 B2 * | 4/2005 | Beitelmal et al. ............ 361/692 |
| 6,880,349 B2 | 4/2005 | Johnson et al. |
| 6,881,142 B1 | 4/2005 | Nair |
| 6,886,353 B2 | 5/2005 | Patel et al. |
| 6,901,767 B2 | 6/2005 | Wood |
| 6,924,981 B2 | 8/2005 | Chu et al. |
| 6,927,980 B2 | 8/2005 | Fukuda et al. |
| 6,944,035 B2 | 9/2005 | Raddi et al. |
| 6,955,058 B2 | 10/2005 | Taras et al. |
| 6,959,558 B2 | 11/2005 | Bean, Jr. et al. |
| 6,964,539 B2 | 11/2005 | Bradley et al. |
| 6,967,283 B2 | 11/2005 | Rasmussen et al. |
| 6,967,841 B1 | 11/2005 | Chu et al. |
| 6,973,797 B2 | 12/2005 | Nemit, Jr. |
| 6,973,801 B1 | 12/2005 | Campbell et al. |
| 6,980,433 B2 | 12/2005 | Fink |
| 7,000,416 B2 | 2/2006 | Hirooka et al. |
| 7,000,467 B2 | 2/2006 | Chu et al. |
| 7,012,807 B2 | 3/2006 | Chu et al. |
| 7,012,825 B2 | 3/2006 | Nielsen |
| 7,020,586 B2 | 3/2006 | Snevely |
| 7,031,870 B2 | 4/2006 | Sharma et al. |
| 7,032,119 B2 | 4/2006 | Fung |
| 7,033,267 B2 | 4/2006 | Rasmussen |
| 7,046,514 B2 | 5/2006 | Fink et al. |
| 7,047,300 B1 | 5/2006 | Oehrke et al. |
| 7,051,802 B2 | 5/2006 | Baer |
| 7,051,946 B2 | 5/2006 | Bash et al. |
| 7,065,600 B2 | 6/2006 | Papa et al. |
| 7,082,541 B2 | 7/2006 | Hammond et al. |
| 7,085,133 B2 | 8/2006 | Hall |
| 7,086,247 B2 | 8/2006 | Campbell et al. |
| 7,091,625 B2 | 8/2006 | Okusawa et al. |
| 7,104,081 B2 | 9/2006 | Chu et al. |
| 7,106,590 B2 | 9/2006 | Chu et al. |
| 7,112,131 B2 * | 9/2006 | Rasmussen et al. .......... 454/184 |
| 7,120,021 B2 | 10/2006 | Hamman |
| 7,120,689 B2 | 10/2006 | Gonsalves et al. |
| 7,140,193 B2 | 11/2006 | Johnson et al. |
| 7,145,772 B2 | 12/2006 | Fink |
| 7,146,353 B2 | 12/2006 | Garg et al. |
| 7,148,796 B2 | 12/2006 | Joy et al. |
| 7,155,318 B2 | 12/2006 | Sharma et al. |
| 7,165,412 B1 | 1/2007 | Bean, Jr. |
| 7,170,745 B2 * | 1/2007 | Bash et al. .................... 361/695 |
| 7,173,820 B2 | 2/2007 | Fink et al. |
| 7,184,269 B2 | 2/2007 | Campbell et al. |
| 7,187,549 B2 | 3/2007 | Teneketges et al. |
| 7,197,433 B2 | 3/2007 | Patel et al. |
| 7,228,707 B2 | 6/2007 | Lifson et al. |
| 7,236,363 B2 | 6/2007 | Belady |
| 7,251,547 B2 | 7/2007 | Bash et al. |
| 7,254,307 B2 | 8/2007 | Xin |
| 7,259,963 B2 | 8/2007 | Germagian et al. |
| 7,270,174 B2 | 9/2007 | Chu et al. |
| 7,272,005 B2 | 9/2007 | Campbell et al. |
| 7,274,566 B2 | 9/2007 | Campbell et al. |
| 7,278,273 B1 * | 10/2007 | Whitted et al. ............... 62/259.2 |
| 7,284,379 B2 | 10/2007 | Pham et al. |
| 7,292,898 B2 | 11/2007 | Clark et al. |
| 7,293,666 B2 | 11/2007 | Mattlin et al. |
| 7,298,617 B2 | 11/2007 | Campbell et al. |
| 7,298,618 B2 | 11/2007 | Campbell et al. |
| 7,313,503 B2 | 12/2007 | Nakagawa et al. |
| 7,315,448 B1 | 1/2008 | Bash et al. |
| 7,319,594 B2 | 1/2008 | Nicolai et al. |
| 7,365,973 B2 | 4/2008 | Rasmussen et al. |
| 7,366,632 B2 * | 4/2008 | Hamann et al. ............... 702/130 |
| 7,403,391 B2 | 7/2008 | Germagian et al. |
| 7,406,839 B2 | 8/2008 | Bean et al. |
| 7,418,825 B1 | 9/2008 | Bean, Jr. |
| 7,426,453 B2 | 9/2008 | Patel et al. |
| 7,438,638 B2 * | 10/2008 | Lewis et al. .................. 454/184 |
| 7,462,453 B2 | 12/2008 | Yamada et al. |
| 7,472,043 B1 | 12/2008 | Low et al. |
| 7,508,663 B2 * | 3/2009 | Coglitore ...................... 361/695 |
| 7,558,649 B1 | 7/2009 | Sharma et al. |
| 7,568,360 B1 | 8/2009 | Bash et al. |
| 7,596,476 B2 | 9/2009 | Rasmussen et al. |
| 7,620,480 B2 | 11/2009 | Patel et al. |
| 7,676,280 B1 | 3/2010 | Bash et al. |
| 7,681,404 B2 | 3/2010 | Bean, Jr. |
| 7,705,489 B2 | 4/2010 | Nielsen et al. |
| 7,726,144 B2 | 6/2010 | Larson et al. |
| 7,775,055 B2 | 8/2010 | Bean et al. |
| 7,881,910 B2 | 2/2011 | Rasmussen et al. |
| 7,885,795 B2 | 2/2011 | Rasmussen et al. |
| 7,957,138 B2 * | 6/2011 | Vaananen et al. ............ 361/690 |
| 7,979,250 B2 | 7/2011 | Archibald et al. |
| 2001/0005894 A1 | 6/2001 | Fukui |
| 2001/0042616 A1 | 11/2001 | Baer |
| 2001/0047213 A1 | 11/2001 | Sepe |
| 2001/0047387 A1 | 11/2001 | Brockhurst |
| 2001/0047410 A1 | 11/2001 | Defosse |
| 2001/0052006 A1 | 12/2001 | Barker et al. |
| 2001/0055965 A1 | 12/2001 | Delp et al. |
| 2002/0004912 A1 | 1/2002 | Fung |
| 2002/0023258 A1 | 2/2002 | Elwahab et al. |
| 2002/0043969 A1 | 4/2002 | Duncan et al. |
| 2002/0055909 A1 | 5/2002 | Fung et al. |
| 2002/0059804 A1 | 5/2002 | Spinazzola et al. |
| 2002/0062454 A1 | 5/2002 | Fung |
| 2002/0071031 A1 | 6/2002 | Lord et al. |
| 2002/0072868 A1 | 6/2002 | Bartone et al. |
| 2002/0112054 A1 | 8/2002 | Hatanaka |
| 2002/0124081 A1 | 9/2002 | Primm et al. |
| 2002/0129355 A1 | 9/2002 | Velten et al. |
| 2002/0130648 A1 | 9/2002 | Raddi et al. |
| 2002/0134096 A1 | 9/2002 | Shim et al. |
| 2002/0134567 A1 | 9/2002 | Rasmussen et al. |
| 2002/0149911 A1 * | 10/2002 | Bishop et al. .................. 361/690 |
| 2002/0161885 A1 | 10/2002 | Childers et al. |
| 2003/0019221 A1 | 1/2003 | Rossi et al. |
| 2003/0033550 A1 | 2/2003 | Kuiawa et al. |
| 2003/0042004 A1 | 3/2003 | Novotny et al. |
| 2003/0084357 A1 | 5/2003 | Bresniker et al. |
| 2003/0084358 A1 | 5/2003 | Bresniker et al. |
| 2003/0084359 A1 | 5/2003 | Bresniker et al. |
| 2003/0115000 A1 | 6/2003 | Bodas |
| 2003/0115024 A1 | 6/2003 | Snevely |
| 2003/0120780 A1 | 6/2003 | Zhu et al. |
| 2003/0121689 A1 | 7/2003 | Rasmussen et al. |
| 2003/0147214 A1 | 8/2003 | Patel et al. |
| 2003/0147216 A1 | 8/2003 | Patel et al. |
| 2003/0154285 A1 | 8/2003 | Berglund et al. |
| 2003/0158718 A1 | 8/2003 | Nakagawa et al. |
| 2003/0184975 A1 | 10/2003 | Steinman et al. |
| 2003/0188208 A1 | 10/2003 | Fung |
| 2003/0193777 A1 | 10/2003 | Friedrich et al. |
| 2003/0196126 A1 | 10/2003 | Fung |
| 2003/0200130 A1 | 10/2003 | Kall et al. |
| 2003/0200295 A1 | 10/2003 | Roberts et al. |
| 2003/0200473 A1 | 10/2003 | Fung |
| 2003/0204756 A1 | 10/2003 | Ransom et al. |
| 2003/0236822 A1 | 12/2003 | Graupner et al. |
| 2004/0003266 A1 | 1/2004 | Moshir et al. |
| 2004/0010569 A1 | 1/2004 | Thomas et al. |
| 2004/0016243 A1 | 1/2004 | Song et al. |
| 2004/0020224 A1 | 2/2004 | Bash et al. |
| 2004/0031280 A1 | 2/2004 | Martin et al. |
| 2004/0031282 A1 | 2/2004 | Kopko |
| 2004/0061030 A1 | 4/2004 | Goodwin et al. |
| 2004/0065097 A1 | 4/2004 | Bash et al. |
| 2004/0065100 A1 | 4/2004 | Jacobsen |
| 2004/0065104 A1 | 4/2004 | Bash et al. |
| 2004/0073597 A1 | 4/2004 | Caveney et al. |
| 2004/0075343 A1 | 4/2004 | Wareham et al. |
| 2004/0075984 A1 | 4/2004 | Bash et al. |
| 2004/0078708 A1 | 4/2004 | Li et al. |
| 2004/0083012 A1 | 4/2004 | Miller |
| 2004/0084967 A1 | 5/2004 | Nielsen |
| 2004/0089009 A1 | 5/2004 | Bash et al. |
| 2004/0089011 A1 | 5/2004 | Patel et al. |
| 2004/0098991 A1 | 5/2004 | Heyes |
| 2004/0099747 A1 | 5/2004 | Johnson et al. |
| 2004/0100770 A1 | 5/2004 | Chu et al. |
| 2004/0120855 A1 | 6/2004 | Reichel et al. |

| | | | |
|---|---|---|---|
| 2004/0155526 A1 | 8/2004 | Naden et al. | |
| 2004/0163001 A1 | 8/2004 | Bodas | |
| 2004/0186905 A1 | 9/2004 | Young et al. | |
| 2004/0189161 A1 | 9/2004 | Davis et al. | |
| 2004/0190247 A1* | 9/2004 | Chu et al. | 361/696 |
| 2004/0230848 A1 | 11/2004 | Mayo et al. | |
| 2004/0240514 A1 | 12/2004 | Bash et al. | |
| 2004/0262409 A1 | 12/2004 | Crippen et al. | |
| 2005/0016189 A1 | 1/2005 | Wacker | |
| 2005/0023363 A1 | 2/2005 | Sharma et al. | |
| 2005/0044882 A1 | 3/2005 | Hong et al. | |
| 2005/0055590 A1 | 3/2005 | Farkas et al. | |
| 2005/0061013 A1* | 3/2005 | Bond | 62/259.2 |
| 2005/0071699 A1 | 3/2005 | Hammond et al. | |
| 2005/0108582 A1 | 5/2005 | Fung | |
| 2005/0111669 A1 | 5/2005 | Park et al. | |
| 2005/0114507 A1 | 5/2005 | Tarui et al. | |
| 2005/0132729 A1 | 6/2005 | Manole | |
| 2005/0170770 A1 | 8/2005 | Johnson et al. | |
| 2005/0177755 A1 | 8/2005 | Fung | |
| 2005/0185654 A1 | 8/2005 | Zadikian et al. | |
| 2005/0198247 A1 | 9/2005 | Perry et al. | |
| 2005/0207909 A1 | 9/2005 | Bean, Jr. et al. | |
| 2005/0210905 A1 | 9/2005 | Burns et al. | |
| 2005/0213306 A1 | 9/2005 | Vos et al. | |
| 2005/0225936 A1 | 10/2005 | Day | |
| 2005/0228618 A1 | 10/2005 | Patel et al. | |
| 2005/0235671 A1 | 10/2005 | Belady et al. | |
| 2005/0237715 A1 | 10/2005 | Staben et al. | |
| 2005/0237716 A1 | 10/2005 | Chu et al. | |
| 2005/0246431 A1 | 11/2005 | Spitaels | |
| 2005/0247829 A1 | 11/2005 | Low et al. | |
| 2005/0248922 A1 | 11/2005 | Chu et al. | |
| 2005/0251802 A1 | 11/2005 | Bozek et al. | |
| 2005/0267639 A1 | 12/2005 | Sharma et al. | |
| 2005/0284169 A1 | 12/2005 | Tamura et al. | |
| 2006/0002086 A1 | 1/2006 | Teneketges et al. | |
| 2006/0025010 A1 | 2/2006 | Spitaels et al. | |
| 2006/0042289 A1 | 3/2006 | Campbell et al. | |
| 2006/0072262 A1 | 4/2006 | Paik et al. | |
| 2006/0080001 A1 | 4/2006 | Bash et al. | |
| 2006/0081545 A1 | 4/2006 | Rassmussen et al. | |
| 2006/0082263 A1 | 4/2006 | Rimler et al. | |
| 2006/0096306 A1 | 5/2006 | Okaza et al. | |
| 2006/0102575 A1 | 5/2006 | Mattlin et al. | |
| 2006/0108481 A1 | 5/2006 | Riedy et al. | |
| 2006/0112286 A1 | 5/2006 | Whalley et al. | |
| 2006/0115586 A1 | 6/2006 | Xing et al. | |
| 2006/0121421 A1 | 6/2006 | Spitaels et al. | |
| 2006/0126296 A1 | 6/2006 | Campbell et al. | |
| 2006/0139877 A1 | 6/2006 | Germagian et al. | |
| 2006/0144073 A1 | 7/2006 | Lee et al. | |
| 2006/0162357 A1 | 7/2006 | Fink | |
| 2006/0168975 A1 | 8/2006 | Malone et al. | |
| 2006/0203834 A1 | 9/2006 | Augustinus | |
| 2006/0214014 A1 | 9/2006 | Bash et al. | |
| 2006/0232945 A1 | 10/2006 | Chu et al. | |
| 2006/0238941 A1 | 10/2006 | Ingemi et al. | |
| 2006/0242288 A1 | 10/2006 | Masurkar | |
| 2006/0250770 A1 | 11/2006 | Campbell et al. | |
| 2006/0260338 A1 | 11/2006 | VanGilder et al. | |
| 2006/0276121 A1 | 12/2006 | Rasmussen | |
| 2007/0025271 A1 | 2/2007 | Niedrich et al. | |
| 2007/0038414 A1 | 2/2007 | Rasmussen et al. | |
| 2007/0072536 A1* | 3/2007 | Johnson et al. | 454/255 |
| 2007/0074537 A1 | 4/2007 | Bean et al. | |
| 2007/0076373 A1 | 4/2007 | Fink | |
| 2007/0078635 A1 | 4/2007 | Rasmussen et al. | |
| 2007/0081302 A1* | 4/2007 | Nicolai et al. | 361/678 |
| 2007/0085678 A1 | 4/2007 | Joy et al. | |
| 2007/0088822 A1 | 4/2007 | Coile et al. | |
| 2007/0091569 A1 | 4/2007 | Campbell et al. | |
| 2007/0091570 A1 | 4/2007 | Campbell et al. | |
| 2007/0121295 A1 | 5/2007 | Campbell et al. | |
| 2007/0129000 A1 | 6/2007 | Rasmussen et al. | |
| 2007/0146994 A1 | 6/2007 | Germagian | |
| 2007/0150215 A1 | 6/2007 | Spitaels et al. | |
| 2007/0150584 A1 | 6/2007 | Srinivasan | |
| 2007/0163748 A1 | 7/2007 | Rasmussen et al. | |
| 2007/0165377 A1 | 7/2007 | Rasmussen et al. | |
| 2007/0167125 A1 | 7/2007 | Rasmussen et al. | |
| 2007/0171613 A1* | 7/2007 | McMahan et al. | 361/695 |
| 2007/0174024 A1 | 7/2007 | Rasmussen et al. | |
| 2007/0187343 A1 | 8/2007 | Colucci et al. | |
| 2007/0190919 A1 | 8/2007 | Donovan et al. | |
| 2007/0213000 A1 | 9/2007 | Day | |
| 2007/0271475 A1 | 11/2007 | Hatasaki et al. | |
| 2007/0274035 A1 | 11/2007 | Fink et al. | |
| 2008/0002364 A1 | 1/2008 | Campbell et al. | |
| 2008/0004837 A1 | 1/2008 | Zwinger et al. | |
| 2008/0037217 A1* | 2/2008 | Murakami et al. | 361/695 |
| 2008/0041076 A1 | 2/2008 | Tutunoglu et al. | |
| 2008/0041077 A1 | 2/2008 | Tutunoglu | |
| 2008/0055852 A1 | 3/2008 | Uluc et al. | |
| 2008/0104985 A1 | 5/2008 | Carlsen | |
| 2008/0105412 A1 | 5/2008 | Carlsen et al. | |
| 2008/0105753 A1 | 5/2008 | Carlsen et al. | |
| 2008/0141703 A1 | 6/2008 | Bean, Jr. | |
| 2008/0142068 A1 | 6/2008 | Bean et al. | |
| 2008/0174954 A1 | 7/2008 | VanGilder et al. | |
| 2008/0177424 A1 | 7/2008 | Wheeler | |
| 2008/0180908 A1 | 7/2008 | Wexler | |
| 2008/0198549 A1 | 8/2008 | Rasmussen et al. | |
| 2008/0229318 A1 | 9/2008 | Franke | |
| 2008/0245083 A1 | 10/2008 | Tutunoglu et al. | |
| 2009/0007591 A1 | 1/2009 | Bean et al. | |
| 2009/0019875 A1 | 1/2009 | Fink et al. | |
| 2009/0030554 A1 | 1/2009 | Bean, Jr. et al. | |
| 2009/0121547 A1 | 5/2009 | Paik et al. | |
| 2009/0138313 A1 | 5/2009 | Morgan et al. | |
| 2009/0138888 A1 | 5/2009 | Shah et al. | |
| 2009/0150123 A1 | 6/2009 | Archibald et al. | |
| 2009/0223234 A1 | 9/2009 | Campbell et al. | |
| 2009/0259343 A1 | 10/2009 | Rasmussen et al. | |
| 2009/0276771 A1 | 11/2009 | Miloushev et al. | |
| 2010/0057263 A1 | 3/2010 | Tutunoglu | |
| 2010/0170663 A1 | 7/2010 | Bean, Jr. | |
| 2010/0211669 A1 | 8/2010 | Dalgas et al. | |
| 2010/0211810 A1 | 8/2010 | Zacho | |
| 2010/0286956 A1 | 11/2010 | VanGilder et al. | |

FOREIGN PATENT DOCUMENTS

| | | | |
|---|---|---|---|
| DE | 102006041788 A1 | 3/2008 | |
| EP | 0602911 A1 | 6/1994 | |
| EP | 1610077 A2 | 12/2005 | |
| EP | 1672300 A1 | 6/2006 | |
| FR | 2624684 A1 | 6/1989 | |
| FR | 2864854 A1 | 7/2005 | |
| JP | 63-127042 A | 5/1988 | |
| JP | 07-044275 A | 2/1995 | |
| JP | 07269926 A | 10/1995 | |
| JP | 09-298377 A | 11/1997 | |
| JP | 2001-260640 A | 9/2001 | |
| JP | 2002-101973 A | 4/2002 | |
| JP | 2002-119339 A | 4/2002 | |
| WO | 00/58673 A1 | 10/2000 | |
| WO | 02/065030 A1 | 8/2002 | |
| WO | 03005200 A1 | 1/2003 | |
| WO | 03/083631 A1 | 10/2003 | |
| WO | 03081406 A1 | 10/2003 | |
| WO | 2005081091 A2 | 9/2005 | |
| WO | 2005122664 A1 | 12/2005 | |
| WO | 2006/034718 A1 | 4/2006 | |
| WO | 2006119248 A2 | 11/2006 | |
| WO | 2006124240 A2 | 11/2006 | |
| WO | 2007095144 A2 | 8/2007 | |
| WO | 2008144375 A2 | 11/2008 | |
| WO | 2009/014893 A1 | 1/2009 | |

OTHER PUBLICATIONS

Neil Rasmussen, "Avoidable Mistakes that Compromise Cooling Performance in Data Centers and Network Rooms," White Paper #49, 2003 American Power Conversion, Rev 2003-0, pp. 1-15.

Neil Rasmussen, "Cooling Options for Rack Equipment with Side-to-Side Airflow," White Paper #50, 2004 American Power Conversion, Rev 2004-0, pp. 1-14.

Neil Rasmussen, "Air Distribution Architecture Options for Mission Critical Facilities," White Paper #55, Revision 1, 2003 American Power Conversion, Rev 2003-0, pp. 1-13.
"How and Why Mission-Critical Cooling Systems Differ From Common Air Conditions," White Paper #56, Revision 2, 2003 American Power Conversion, Rev 2003-2, pp. 1-13.
Tony Evans, "Fundamental Principles of Air Conditioners for Information Technology," White Paper #57, Revision 1, 2004 American Power Conversion, Rev 2004-1, pp. 1-9.
Tony Evans, "Humidification Strategies for Data Centers and Network Rooms," White Paper 58, 2004 American Power Conversion, Rev 2004-0, pp. 1-13.
Tony Evans, "The Different Types of Air Conditioning Equipment for IT Environments," White Paper #59, 2004 American Power Conversion, Rev 2004-0, pp. 1-21.
Neil Rasmussen, "Guidelines for Specification of Data Center Power Density," White Paper #120, 2005 American Power Conversion, Rev 2005-0, pp. 1-21.
International Search Report for PCT/US2006/037772 mailed Jul. 10, 2007.
"Enthalpy" Published by the National Aeronautics and Space Administration and edited by Tom Benson. Retrieved on Jul. 13, 2009 from http://www.grc.nasa.gov/WWW/K-12/airplane/enthalpy. html, pp. 3.
Althouse, Turnquist, Bracciano: "Modern Refrigeration and Air Conditioning," 2000, The Goodheart-Willcox Company, Inc., XP002479591, pp. 715-716.
International Search Report for PCT/US07/01109 mailed Mar. 28, 2008.
International Search Report for PCT/US2007/087910 mailed Apr. 15, 2009.
International Search Report for PCT/US2007/087928 mailed Jul. 29, 2008.
International Search Report for PCT/US2009/043400 mailed Nov. 23, 2009.
International Search Report for PCT/US2010/035089 mailed Jul. 26, 2010.
Le et al., "Operating Behaviour of Single Split Coil Systems Under Modulating and Two-Position Control", Published 2005 by American Society of Heating, Refrigerating and Air-Conditioning Engineers, Inc.
Modern Refrigeration and Air Conditioning (18th Edition) Althouse et al. Published by The Goodheart-Willcox Company, Inc. (c)2000.
Rittal Catalogue, Aug. 2005, p. 115 and p. 140.
Thermodynamics: An Engineering Approach (Fourth Edition) Cengel et al. Published by McGraw Hill (c)2004.
"Management Strategy for Network Critical Physical Infrastructure", White Paper #100, pp. 110, American Power Conversion, Dec. 15, 2003, published on World Wide Web.
Abdlmonem H. Beitelmal.: "Thermo-Fluids Provisioning of a High Performance High Density Data Center" Distributed and Parallel Databases, Kluwer Academic Publishers, BO, vol. 21, No. 2-3, Apr. 22, 2006, pp. 227-238, XP019499843, ISSN: 1573-7578.
Abi-Zadeh, Davar et al., "A Transient Analysis of Environmental Conditions for a Mission Critical Facility after a Failure of Power", Arup Mission Criticial Facilities, Feb. 2001, pp. 1-12.
Ahmad, Jasim U. et al., "Navier-Stokes simulation of air-conditioning facility of a large modern computer room," Jun. 2005, Proceedings of the 2005 ASME Fluids Engineering Division Summer Meeting and Exhibition, pp. 1-6.
APC User's Guide Brochure, "InfraStruXure Manager," Mar. 2004, 181 pgs.
ASHRAE, "Thermal Guidelines for Data Processing Environments" 2004, Atlanta: American Society of Heating, Refrigerating, and Air-Conditioning Engineers, Inc., 2004, Atlanta.
Bash, C. E. et al.: "Balance of Power: Dynamic Thermal Management for Internet Data Centers", IEEE Internet Computing , Jan. 1, 2005, pp. 42-49, vol. 9, No. 1, IEEE Service Center, New York, NY.
Bash, C.E., Patel, C.D., and Sharma, R.K., "Efficient Thermal Management of Data Centers—Immediate and Long-Term Research Needs" Intl. J. Heat, Ventilating, Air-Conditioning and Refrigeration Research, 2003, pp. 137-152, vol. 9, No. 2.

Beitelmal et al., "Thermo-Fluids Provisioning of a High Performance High Density Data Center", Apr. 22, 2006, Springer Science and Business Media, Inc, Distributed and Parallel Databases, 21, pp. 227-238 DOI:1 0.1 007/s1 0619-005-0413-0.
Chandrakant D. Patel, et al., "Thermal Considerations in Cooling Large Scale High Copute Density Data Centers" IEEE 2002, pp. 767-776.
Dvinsky: "Hot Tips for Using Cooling Software a Little Planning Lets Users Get More from Their Thermal-Simulation Software", Machine Design, Penton Media, Cleveland, OH, vol. 72, No. 4, Feb. 24, 2000.
Ehsan Pakabaznia et al., "Miminizing data center cooling and server power costs", Proceedings of the 14th ACM/IEEE International Symposium on Low Power Electronics and Design, ISLPED '09, Jan. 1, 2009, p. 145, XP55015368, New York, New York, USA, DOI: 101145/1594233.1594268, ISBN: 978-1-60-558684-7.
Herrlin, M.K., "Rack Cooling Effectiveness in Data Centers and Telecom Central Offices: The Rack Cooling Index (RCI)," ASHRAE Transaction, 2005, pp. 725-731, vol. 111(2).
Innovative Research, Inc., http://web.archive.org/web/20051221005029/http://www.inres.com/, Dec. 21, 2005, published on World Wide Web.
International Search Report and Written Opinion from corresponding International Application No. PCT/2010/022074, dated Jul. 27, 2010.
International Search Report and Written Opinion from corresponding International Application No. PCT/US2011/052561, dated Dec. 27, 2011.
International Search Report for PCT/US2006/16739 mailed Oct. 3, 2006.
International Search Report for PCT/US2008/051908 mailed Jul. 3, 2008.
International Search Report for PCT/US2009/065700 mailed Feb. 18, 2010.
International Search Report for PCT/US2010/023142, mailed May 11, 2010.
International Search Report for PCT/US2010/033867 mailed Jul. 7, 2010.
International Search Report for PCT/US2010/033876 mailed Jul. 1, 2010.
International Search Report for PCT/US2011/051866 mailed Feb. 24, 2012.
International Search Report for PCT/US2011/067332 mailed Jun. 8, 2012.
Jeffrey Rambo et al., "Modeling of data center airflow and heat transfer: State of the art and future trends", Distributed and Parallel Databases, Kluwer Academic Publishers, BO, vol. 21, No. 2-3, Jan. 20, 2007, pp. 193-225, XP019499845, ISSN: 1573-7578, DOI:10. 1007/S10619-006-7007-3.
K. Dunlap, "Cooling Audit for Identifying Potential Cooling Problems in Data Centers", White Paper #40, pp. 1-18, American Power Conversion, May 20, 2004, published on World Wide Web.
N. Rasmussen, "Calculating Total Cooling Requirements for Data Centers", White Paper #25, pp. 1-8, American Power Conversion, May 20, 2004, published on World Wide Web.
N. Rasmussen, "Cooling Strategies for Ultra-High Density Racks and Blade Servers", White Paper #46, pp. 1-22, American Power Conversion, Mar. 29, 2005, published on World Wide Web.
N. Rasmussen, "Strategies for Deploying Blade Servers in Existing Data Centers", White Paper #125, pp. 1-14, American Power Conversion, Mar. 29, 2005, published on World Wide Web.
Pinheiro, Eduardo, "Load Balancing and Unbalancing for Power and Performance in Cluster-Based Systems," Internet Citation, May 1, 2001 URL:http://research.ac.upc.es/pact01/colp/paper04.pdf, retrieved on Nov. 17, 2003.
Rittal, <http://www.rittal.com/services_support/downloads/brochures.asp>, download page for catalogue 31, May 20, 2010.
Rittal, Catalogue 31, front page p.672 and back page, Apr. 2005.
Sharma, R.K, Bash, C.E., and Patel, C.D, "Dimensionless Parameters for Evaluation of Thermal Design and Performance of Large-Scale Data Centers." 8th ASME/AIAA Joint Thermophysics and Heat Transfer Conference, Jun. 24-26, 2002. St. Louis, Missouri.

Shrivastava S K et al., Optimization of Cluster Cooling Performance for Data Centers, Thermal and Thermomechanical Phenomena in Electronic Systems, May 28, 2008, pp. 1161-1166, 11th Intersociety Conference on, IEEE, Piscataway, NJ.

VanGilder et al., "Airflow Uniformity thourhg Perforated Tiles in a Raised-Floor Data Center", White Paper 121, Jul. 17-22, 2005, 10 pages.

VanGilder, James W. et al., "Caputure index: an airflow-based rack cooling performance metric," 2007, ASHRAE Transactions, vol. 113, pp. 126-136.

VanGilder, James W. et al., "Real-Time prediction of rack-cooling performance," 2006, ASHRAE Transactions, vol. 112, pp. 151-162.

* cited by examiner

IN-ROW AIR CONTAINMENT AND COOLING SYSTEM AND METHOD

RELATED APPLICATION

This application claims priority under 35 U.S.C. §119(e) to U.S. Provisional Application Ser. No. 60/881,969, filed on Jan. 23, 2007, entitled "IN-ROW AIR CONTAINMENT AND COOLING SYSTEM AND METHOD," which is hereby incorporated by reference in its entirety for all purposes.

BACKGROUND OF THE INVENTION

1. Field of the Disclosure

The present disclosure relates to racks and enclosures, and more particularly to methods and systems for cooling electronic equipment contained in racks and enclosures.

2. Discussion of Related Art

Equipment enclosures or racks for housing electronic equipment, such as data processing, networking and telecommunications equipment have been used for many years. Such racks are used to contain and to arrange the equipment in small wiring closets as well as equipment rooms and large data centers. In certain embodiments, an equipment storage rack can be an open configuration and can be housed within a rack enclosure, although the enclosure may be included when referring to a rack.

Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry-standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard.

Management systems have been developed to manage the power distribution and cooling systems of data centers containing racks. One such management system is known as the InfraStruXure™ ("ISX") manager offered by American Power Conversion Corporation of West Kingston, R.I., the assignee of the present disclosure, which is particularly designed to control the operation of large data centers.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by computer room air conditioner ("CRAC") units that are typically hard piped, immobile units positioned around the periphery of the data center room. These CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks.

The rack-mounted equipment typically cools itself by drawing air along a front side or air inlet side of a rack, drawing the air through its components, and subsequently exhausting the air from a rear or vent side of the rack. A disadvantage of the CRAC-type air conditioning system is that cool air is mixed with the room temperature air, which is inefficient. Ideally, to make the system as efficient as possible, and to utilize as little energy and floor space as possible, the highest possible temperature air should be drawn into the CRAC units and the outlet air generated by the CRAC should be a few degrees below room temperature. In addition, airflow requirements can vary considerably as a result of different numbers and types of rack-mounted components and different configurations of racks and enclosures.

SUMMARY OF THE INVENTION

One aspect of the disclosure is directed to an in-row electronic equipment storage system. According to an embodiment, a system includes an electronic equipment rack and a cooling rack. The electronic equipment rack has a housing adapted to receive electronic equipment, and an electronic equipment rack air cavity. The cooling rack includes a housing adapted to receive cooling equipment, and a cooling rack air cavity. The cooling rack is configured to be disposed adjacent to the electronic equipment rack. An interface allows for fluid communication between the cooling rack air cavity and the electronic equipment air cavity. The interface may include dampers to control air flow between the air cavities.

In certain embodiments, the air cavity of each cooling rack includes a side wall having an opening formed therein. The air cavity of each equipment rack includes a side wall having an opening formed therein. The arrangement is such that the opening of sidewall of the cooling rack corresponds to the opening of the sidewall of the equipment rack. The opening of the cooling rack and the opening of the equipment rack define an air plenum between the equipment rack and the cooling rack.

Another aspect of the disclosure is directed to a method of cooling an electronic equipment rack of the type comprising a housing defining a volume of space adapted to receive electronic equipment. In one embodiment, the method comprises: positioning cooling rack next to the equipment rack, the cooling rack comprising a housing defining a volume of space adapted to receive cooling equipment; forming an opening in the housing of the equipment rack; forming an opening in the housing of the cooling rack; and aligning the opening of the equipment rack with the opening of the cooling rack to provide fluid communication between the volume of space of the equipment rack and the volume of space of the cooling rack.

In one embodiment, the method further comprises selectively closing one of the openings of the equipment rack and the cooling rack.

BRIEF DESCRIPTION OF THE DRAWINGS

For a better understanding of the present disclosure, reference is made to the figures which are incorporated herein by reference and in which.

DETAILED DESCRIPTION OF THE PREFERRED EMBODIMENTS

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Figure 1:
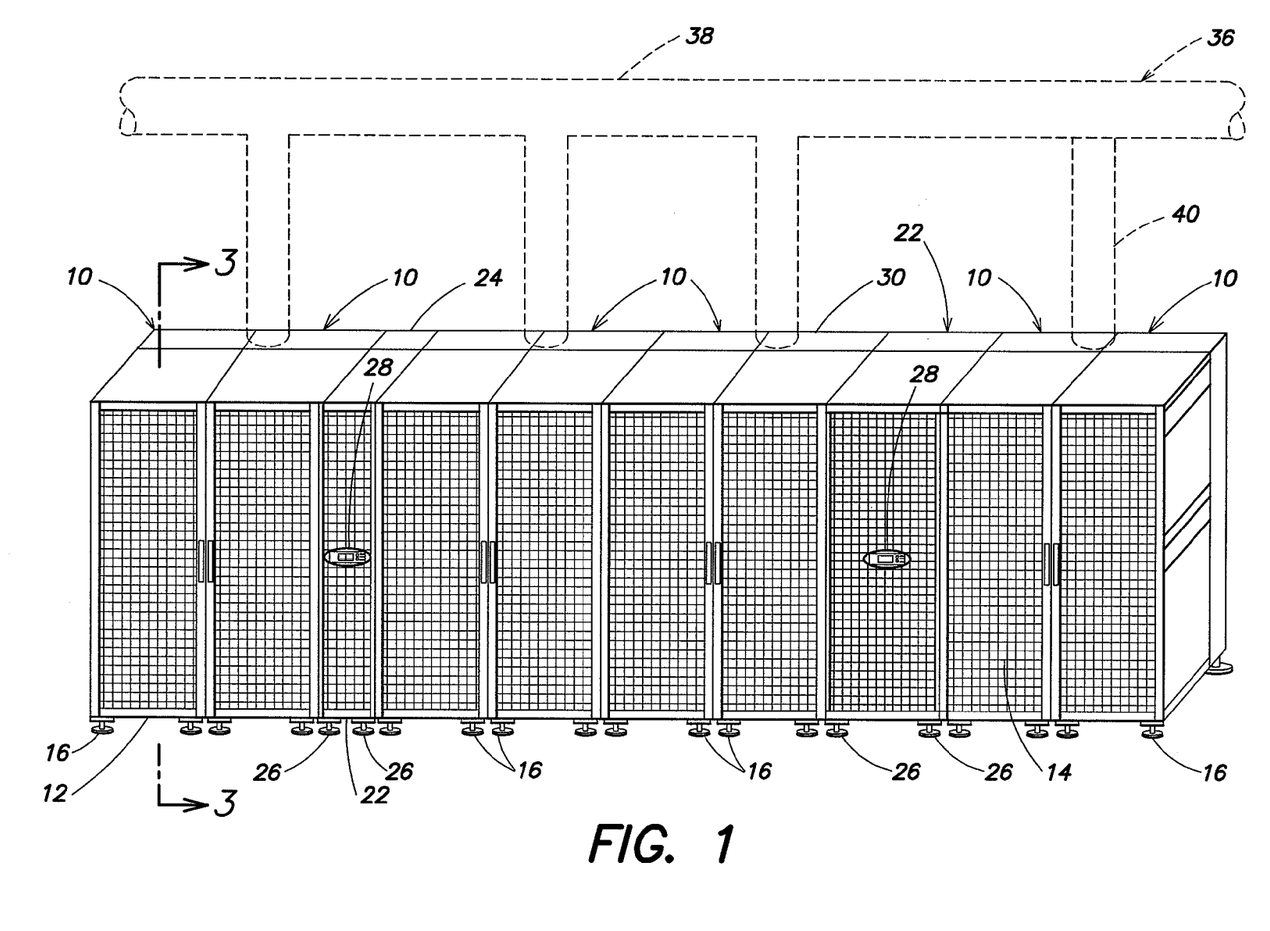
FIG. 1 is a front perspective view of an in-row cooling system provided in a plurality of electronic equipment storage racks and cooling racks of an embodiment of the disclosure.

Turning now to the drawings, and more particularly to FIG. 1, there is shown a portion of a typical data center. As discussed above, the data center may be designed to house a number of equipment racks, each generally indicated at 10. In one embodiment, each equipment rack 10 may be constructed in accordance with the teachings disclosed in U.S. patent application Ser. No. 10/990,927, entitled EQUIPMENT ENCLOSURE KIT AND ASSEMBLY METHOD, filed on Nov. 17, 2004, which is owned by the assignee of the present disclosure and is incorporated herein by reference. Further, although not shown specifically in FIG. 1, cabling between the equipment racks may be implemented using cable distribution troughs contained on the roofs of the racks as disclosed in U.S. Pat. No. 6,967,283, which is incorporated herein by reference and assigned to the assignee of the present disclosure. The principles disclosed herein may be adapted to smaller data centers, equipment rooms, computer rooms, and even wiring closets. The data center described herein and shown in FIG. 1 is for illustration purposes only.

Each equipment rack 10 may be configured to include a frame or housing 12 adapted to support electronic components, such as data processing, networking and telecommunications equipment. The housing 12 includes a front, back, sides, a bottom and a top. The front of each equipment rack 10 may include a front door 14 so as to enable access into the interior of the equipment rack. A lock may be provided to prevent access into the interior of the equipment rack 10 and the equipment housed by the equipment rack. The sides of the equipment rack 10 may include at least one panel to enclose the interior region of the rack. Although not illustrated in FIG. 1, the back of the equipment rack may also include at least one panel or a back door or doors to provide access to the interior of the equipment rack from the back of the rack. In certain embodiments, the side and back panels, as well as the front door 14 and the rear door(s), may be fabricated from perforated sheet metal, for example, to allow air to flow into and out of the interior region of the equipment rack. In other embodiments, the front door may include a removable panel, either perforated, partially perforated or solid.

The equipment racks are modular in construction and configured to be rolled into and out of position, e.g., within a row of the data center. Casters (not shown) may be are secured to the bottom of each equipment rack to enable the rack to roll along the floor of the data center. Once positioned, leveling feet, each indicated at 16 in FIG. 1, may be deployed to securely ground the equipment rack 10 in place within the row. An example of casters and leveling feet 16 employed on such an equipment rack is disclosed in detail in U.S. patent application Ser. No. 10/990,927.

Figure 3:
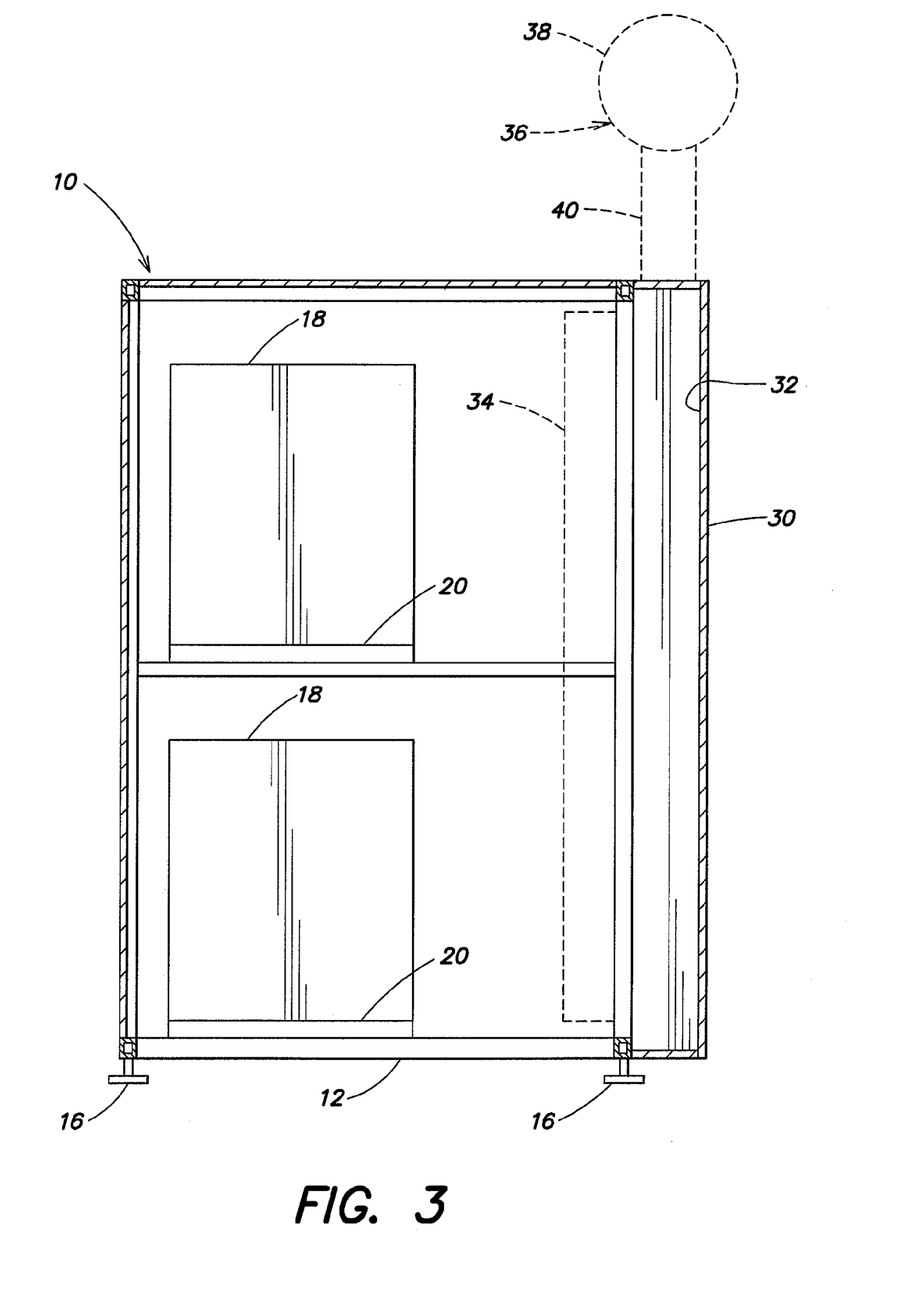
FIG. 3 is a cross sectional view taken along line 3-3 of FIG. 1.

With reference to FIG. 3, once in position, electronic equipment 18 may be positioned in the interior region of the equipment rack 10. For example, the electronic equipment may be placed on shelves, each indicated at 20, secured within the interior region of the equipment rack 10. Although not illustrated in FIG. 1, cables providing electrical and data communication may be provided through the top of the equipment rack either through a cover (or "roof" as described in U.S. Pat. No. 6,967,283) at the top of the equipment rack having openings formed therein or through an open top of the equipment rack. In this embodiment, the cables may be strung along the roofs of the rack or be provided in the aforementioned cable distribution trough. In another embodiment, the cables may be disposed within a raised floor and connected to the electronic equipment through the bottom of the equipment rack. With both configurations, power and communication lines (and any other related component) may be provided to the equipment racks.

As discussed above, data centers are typically configured with rows of equipment racks arranged such that cool air is drawn into the racks from a cool aisle and warm or hot air is exhausted from the racks into a hot aisle. In one embodiment, the equipment racks may be arranged in two rows with the fronts of the equipment racks in a near row being arranged in a forward direction and the backs of the equipment racks in a far row being arranged in a rearward direction. However, as stated above, in a typical data center, there may be multiple rows of equipment racks wherein the rows may be arranged with the fronts of the equipment racks facing one another to define the cold aisle and with the backs of the equipment racks facing one another to define the hot aisle.

In order to address the heat build-up and hot spots within the data center or equipment room, and to address climate control issues within the data center or room in general, a cooling system, such as a modular cooling system, may be provided in one embodiment. Such a modular cooling system is described in pending U.S. patent application Ser. No. 11/335,874, entitled COOLING SYSTEM AND METHOD, filed on Jan. 19, 2006, which is owned by the assignee of the present disclosure and is incorporated herein by reference. As shown in FIG. 1, the cooling system may include a plurality of cooling racks, each generally indicated at 22, disposed within the data center. As shown, the arrangement is such that there is a cooling rack 22 for every two equipment racks 10 provided in the data center. However, it should be understood that a person of ordinary skill in the art may provide more or less cooling racks 22 within the data center depending on environmental conditions and requirements of the data center. Further in some embodiments, the concentration and locations of cooling racks may be adjusted based on the locations of the hottest equipment racks in the data center, or based on information obtained and analyzed by a data center information management system.

In one embodiment, the data center, equipment room or wiring closet may further include a coolant medium inlet and a coolant medium outlet adapted to deliver and return a coolant medium (e.g., water, a glycol solution or a liquid coolant, such as R134A and R410A coolants) from a suitable source, such as a chiller unit. Specifically, the coolant medium inlet may be adapted to deliver chilled or cooled coolant to the data center, whereas the coolant medium outlet is adapted to exhaust heated coolant from the data center. In a certain embodiment, the inlet and outlet may be in fluid communication with a manifold or distribution box. The distribution box may include an enclosure positioned in the data center, which may be constructed similarly to the equipment rack. The distribution box may be designed to distribute chilled coolant to and to accept heated coolant from each cooling rack. In certain embodiments, the distribution box may be conveniently located within the data center, and in other embodiments, may be located outside the data center.

Details of the modular cooling system and its various components and configurations may be found in pending U.S. patent application Ser. No. 11/335,874. Also, the cooling system may embody other cooling configurations, such as those offered by American Power Conversion Corporation of West Kingstown, R.I., the assignee of the present disclosure. Also, as will be discussed in greater detail below, FIG. 1 illustrates a ½ cooling rack 22 and a full-sized cooling rack (also indicated at 22) employed in the row of equipment.

In one embodiment, a management system may be provided to monitor and display conditions of a cooling rack. As will be described in greater detail below, the management system may operate independently to control the operation of the cooling rack, and may be configured to communicate with a higher level network manager or with a management system associated with the equipment storage racks.

In one embodiment, a controller may be provided to control the operation of the cooling racks. In a certain embodiment, the controller may be a dedicated unit to the cooling system of the data center. In another embodiment, the controller may be provided as part of an integrated data center control and monitoring system. In yet another embodiment, each cooling rack may be independently operable by a controller provided in the cooling rack that is in communication with controllers of the other cooling racks. With this particular embodiment (i.e., each cooling rack being configured to be independently operable by controller), each controller unit may embody a 16-bit microprocessor. Notwithstanding the particular configuration, the controller may be designed to control the independent operation of the cooling racks within the data center.

For example, the controller may be configured to identify the failure or inability of a particular cooling rack located within the data center to cool the air, and to increase the cooling capacity of a cooling rack or cooling racks located near the failed cooling rack. In another embodiment, one cooling rack may operate as the main or master cooling unit and the other cooling racks operate as subservient units that are under the control of the main unit. In this embodiment, the main cooling rack may be manipulated by the data center operator to control the entire cooling system. For example, the controller may be configured to receive information from the equipment racks so as to determine the amount of power being drawn by each equipment rack. With this knowledge, the controller may be configured to increase the cooling capacity of certain cooling racks within the cooling system based on the energy drawn by the equipment racks.

As shown in FIG. 1, in one embodiment, a housing of the cooling rack 22 has a width that is approximately one-half the width of the housing 12 of the equipment rack 10. As stated above, a typical nineteen inch equipment rack has a width of approximately twenty-four inches. Thus, the width of the housing 24 of the cooling rack is approximately twelve inches. This sizing enables the person configuring the data center to position a cooling rack or multiple cooling racks in between equipment racks while being able to maintain equivalent spacing among several rows. The narrower width also takes up less space, and, coupled with the modular and movable nature of the cooling rack 22, enables the cooling rack to be conveniently placed between two equipment racks in an easily scalable manner.

Although the housing 24 of the cooling rack 22 is illustrated in the drawings as being one-half the width of the housing 12 of the equipment rack 10, the cooling rack may be sized to any desired configuration. The provision of a cooling rack 22 having one-half the industry-standard width improves the scalability of the cooling rack. However, it is contemplated, for example, to configure the housing to have the same width as the housing of the equipment rack. For example, as shown in FIG. 1, a cooling rack may be constructed to have a full width housing and configured with cooling system components that increases the cooling capacity of the cooling rack. This configuration may be desirable for addressing hot spots within the data center.

With certain embodiments, the cooling racks 22 are modular in construction and configured to be rolled into and out of position, e.g., within a row of the data center between two equipment racks. As with the equipment racks, casters (not shown) may be secured to the bottom of the housing 24 of the cooling rack 22 to enable the cooling rack to roll along the floor of the data center. Once positioned, leveling feet 26 may be deployed to securely ground the cooling rack 22 in place within the row. The casters and leveling feet, and their attachment to the housing of the cooling rack, are disclosed in detail in U.S. patent application Ser. No. 10/990,927. In another embodiment, the housing 24 of the cooling rack 22 may be formed with an eye-bolt to enable a crane or some other lifting apparatus to raise and place the cooling rack within the data center.

In one embodiment, the arrangement is such that the fronts of the equipment and cooling racks 10, 22 are adjacent the cold aisle and the backs of the racks are adjacent the hot aisle. The modular and movable nature of the cooling rack 22 makes it particularly effective in cooling locations within the data center requiring climate control, e.g., adjacent a hot aisle. This configuration enables the cooling rack 22 to be used as a building block for data center cooling and climate control, as the data center operator adds and removes cooling racks on an as needed basis. Thus, the cooling rack 22 allows a far superior level of scalability than prior cooling systems and methods. In addition, an operable cooling rack may be quickly and easily provided to replace a failed cooling rack.

The controller may be adapted to control the operation of the cooling system based on environmental parameters obtained by the controller. In one embodiment, the controller may control the operation of the cooling system by controlling a damper between a cooling rack air cavity and an electronic equipment air cavity. In another embodiment, the controller may control the individual operation of coolers of the cooling racks. In another embodiment, the controller may embody only controller units provided in the cooling racks that communicate with one another over a controller area network (CAN) Bus. In other embodiments, a master controller may be provided to control the operation of the controller units. As shown in FIG. 1, each cooling rack 22 may be provided with a display assembly 28 operably coupled to the controller. The display assembly 28 is adapted to display the environmental conditions of the data room, such as, and not limited to, the temperature and the humidity of the data center at the cooling rack, the temperature of the air entering into and exiting out of the cooling rack, the temperature of coolant entering into and exiting out of the cooling rack, the flow rate of coolant entering the cooling rack, and the cooling capacity of the cooling rack. Suitable monitors and/or gauges may be provided to acquire such information and communicate the information to the controller. Alternatively, or in addition to the foregoing embodiment, the environmental conditions may be displayed on a unit provided with an integrated data center control and monitoring system.

In one embodiment, the display assembly 28 includes a display unit having a liquid crystal display, for example, to display the environmental conditions, such as temperature and humidity of the data center, the temperature of air entering into and exiting out of each cooling rack, the temperature of coolant entering into and exiting out of each cooling rack, and the flow rate of coolant entering such cooling rack. A plurality of control buttons and status indicators are further provided on the display unit to enable the operator to manipulate the operation of the cooling system.

Changes to the environmental conditions of the data center, such as the temperature of the data center, results in changes of inputs including the temperature of the coolant flowing into and out of each cooling rack. Further inputs provided to the controller include the flow rate of coolant entering into the cooling rack, as well as the known values of the coolant (e.g., water). Based on the temperature of the coolant, the flow rate of the coolant, the total heat transfer may be determined, which is calculated by multiplying the flow rate by the coolant density, by the specific heat of the coolant, and by the difference between the coolant outlet and inlet temperatures. This heat transfer calculation is determined by the controller so that the amount of coolant delivered to a cooling rack may be calculated. The controller may be further configured to allow for user input for calculating load capacity of each cooling rack in real time. The value obtained may be compared to the maximum possible cooling capacity to assess the reserve cooling capacity of the cooling system.

For example, the total gross cooling capacity of a cooling rack may be determined by the following equation:

$$\text{total gross cooling capacity} = \text{constant} \times \text{flow rate} \times (T_{out} - T_{in}) \quad (1)$$

With equation (1), the flow rate is identified in gallons per minute (GPM) and the constant is 501. Based on this result, the total net cooling capacity in BTU per hour may be determined by the following equation:

$$\text{Total net cooling capacity} = \text{total gross cooling capacity} - \text{fan heat} \quad (2)$$

Equation (2) may also be arrived at by adding the sensible cooling capacity and the latent cooling capacity.

The management system of embodiments of the present disclosure may be particularly employed in configurations where it is desirable to network several equipment storage racks. With the display units of the management system, the equipment operator need only view the display units to determine the status of the equipment contained in the equipment storage racks. The management system offers a concise, local aggregation of device status and conspicuous indication of troubled conditions, if they occur. The management system is capable of retrofit applications, with the controller unit being mounted within the enclosure at the back of the enclosure and the display unit being mounted on the front door of the enclosure. Thus, the management system may be provided as a kit to the customer for such retrofit applications.

As shown in FIG. 1, and with additional reference to FIGS. 2-14, the equipment and cooling racks 10, 22 may be extended to create an air plenum 30, which extends across backs of the equipment racks and the cooling racks. Specifically, as illustrated in the shown embodiment, the backs of the equipment and cooling racks 10, 22 that face the hot aisle, for example, may be extended a certain length to create an air cavity that forms a segment of the air plenum 30. In certain examples, the widths of the equipment and cooling racks 10, 22 may be extended between six and twelve inches so as to create an air cavity that forms a segment of the air plenum 30. In other embodiments, as will be discussed below, it may be desirable to extend the width of the equipment and cooling racks at the fronts of the racks. In yet another embodiment, it may be desirable to extend the heights of the equipment and cooling racks to create the air plenum.

The air cavities, are configured to provide fluid communication between the equipment racks 10 and the cooling racks 22 through the air plenum 30. Specifically, warm air is capable of traveling within the air plenum 30 from the equipment racks 10 to the cooling racks 22 to cool the warm air generated by the electronic equipment 18 contained by the equipment racks. As best shown in FIG. 3, there is illustrated a cross-sectional view of the equipment rack 10, showing the interior of the equipment rack. It should be understood that a person having ordinary skill in the art, given the benefit of this disclosure, may construct the cooling racks in a similar or identical manner. Specifically, the side walls of the equipment rack 10 may be configured with an opening 32 that is adjacent the back of the rack that extends from the top of the rack to the bottom rack. As mentioned above, the width of the opening 32 may be between six and twelve inches. However, the size of the opening 32, including the height and width of the opening, may be constructed and arranged to meet the air flow requirements of the particular system. It should be understood that either side wall, or both side walls, depending on the air flow requirements, may be configured to be selectively opened to allow air flow to and from the equipment rack 10 to its adjacent racks (either equipment or cooling racks 10, 22). The arrangement is such that warm air produced by a particular equipment rack 10 may flow through the openings 32 to an adjacent cooling rack 22 to cool the air before it is deposited back into the data center. Also, as will be discussed in greater detail below, the size of each opening 32 may be selectively opened or closed to enable or restrict the air flow through the air plenum, respectively.

The opening in a side wall may be selectively blocked by a panel 34 (shown in dashed lines in FIG. 3). In one embodiment, the panel 34 may take the form of a "pocket door" that is slidable with respect to the housing 12 of the equipment rack 10 so that the panel moves from a first position in which the panel completely blocks the opening to a second position in which the panel is moved out of the way so as to expose the entire opening. With this embodiment, the size of the opening may be selectively configured by sliding the panel between its first and second positions. Thus, when it is desirable to somewhat restrict the flow of air through the air plenum 30, the panel 34 may be slid to a desired position in which the opening 32 is partially opened. In other embodiments, the panel may be secured to the wall of the housing of the equipment rack by suitable fasteners. For example, retaining clips may be used to secure the panel in place. In further embodiments, the panel may be hingedly connected to the side wall of the housing of the equipment rack so as to move between open and closed positions.

Figure 2:
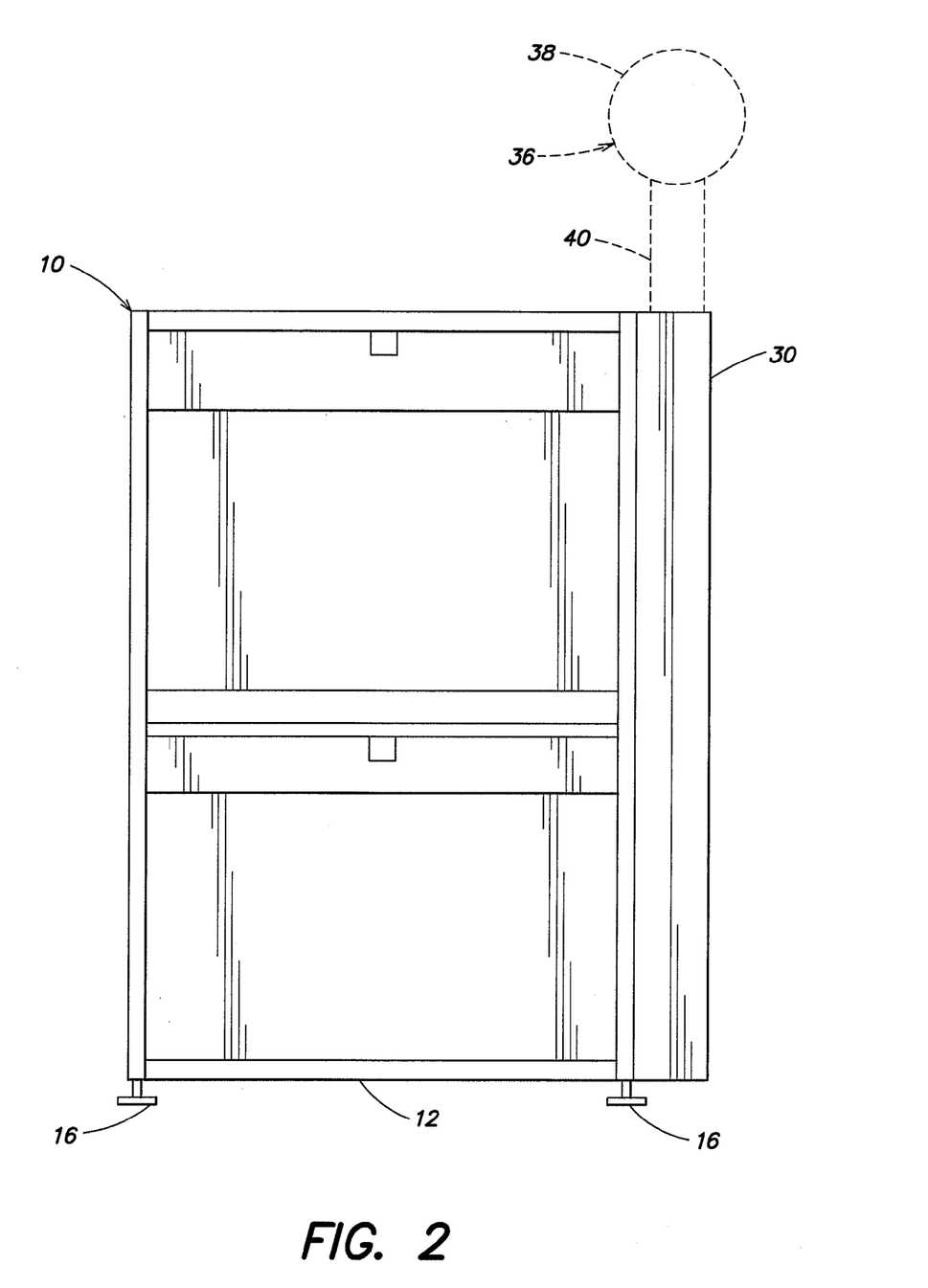
FIG. 2 is a side elevational view of an equipment storage rack of an embodiment of the disclosure.

As shown in FIGS. 1 and 2, the equipment racks 10 and the cooling racks 22 may be connected to an overhead ventilation system, generally indicated at 36 by dashed lines, which may be dedicated to the in-row cooling system or part of a cooling system of the data center. Specifically, the ventilation system 36 includes a main air duct 38 that may be connected to the air plenum 30 by one or more smaller conduits, each indicated at 40, which extend from the main air duct to the air plenum along the length of the air plenum. The arrangement is such that hot air may be exhausted through the main air duct to a location removed from the data center. Conversely, the main air duct may be configured to deliver cool air to the air plenum to further the cooling of the equipment housed by the equipment storage racks.

As discussed above, the cooling racks may be operably controlled by any number of management systems. For example, each cooling unit may be configured with a dedicated controller that controls the operation of the cooling rack. Alternatively, the controller unit may be controlled by a master controller unit or by a network manager to control of the operation of each individual cooling rack. Notwithstanding the particular configuration, the capacity of each cooling unit may be carefully monitored and controlled to deliver the appropriate amount of cool air to the system.

In one embodiment, warm air generated by the equipment racks 10 is directed to the air plenum 30 by suitable air moving devices, e.g., fans, provided in the cooling racks 22. This air is drawn through the air plenum 30 to the cooling racks 22 to cool the warm air produced by the electronic equipment housed by the equipment racks. In another embodiment, the equipment racks may be configured with air moving devices, e.g., fans, to draw cold air from the air plenum from either the cooling racks or the ventilation system, through the equipment rack, and out the front of the equipment rack, e.g., through a perforated door of the equipment rack.

Figure 4:
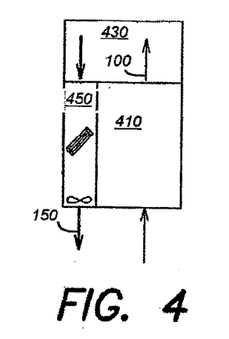
FIGS. 4-14 are schematic views of cooling systems of alternative embodiments.
Figure 5:
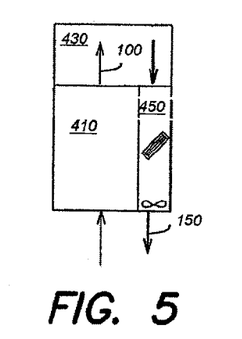
Figure 6:
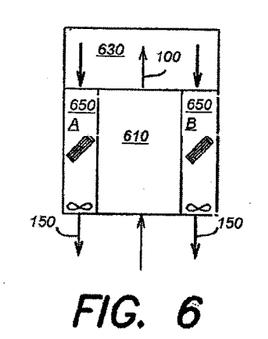
Figure 7:
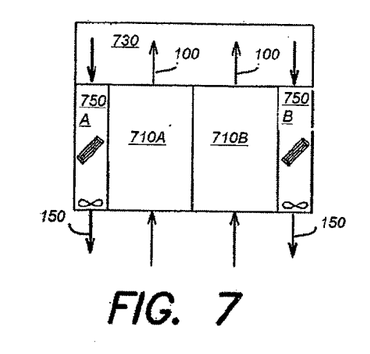
Figure 8:
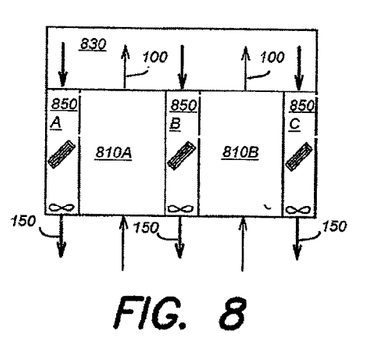
Figure 9:
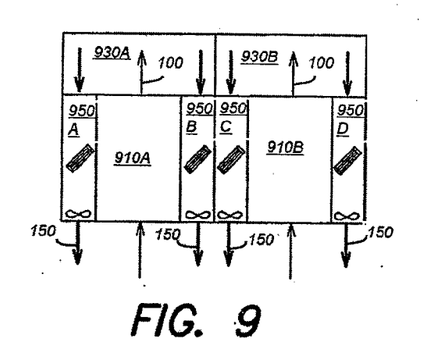

FIGS. 4-14 illustrate various embodiments of the in-row air containment and cooling system, with arrows showing the air flow through the particular system. For example, FIGS. 4 and 5 show a standard sized rack 410 positioned next to a ½ cooling rack 450. As shown, warm air 100 generated by the equipment rack 410 is drawn to the ½ cooling rack through a plenum 430 for cooling. Once cooled, the air 150 travels through the cooling rack back to the data center. The embodiments shown in FIGS. 6-14 operate similarly. For example, FIG. 6 illustrates an equipment rack 610 disposed between two cooling racks 650A, 650B, having an air plenum 630 bridging the racks. FIG. 7 shows two equipment racks 710A, 710B disposed between two cooling racks 750A, 750B, having an air plenum 730 bridging the racks. In FIG. 8, three cooling racks 850A, 850B, 850C, abut two equipment racks 810A, 810B, with air plenum 830 bridging the racks. FIG. 9 shows a pair of equipment racks 910A, 910B with each equipment rack having a cooling rack disposed on either side of the equipment rack, i.e., cooling racks 950A, 950B and 950C, 950D, respectively. In the system of FIG. 9, each of the equipment racks has an air plenum 930A, 930B bridging the air cavities of each equipment rack 910A, 910B to its respective cooling racks 950A, 950B, 950C, 950D.

Figures 10, 12:
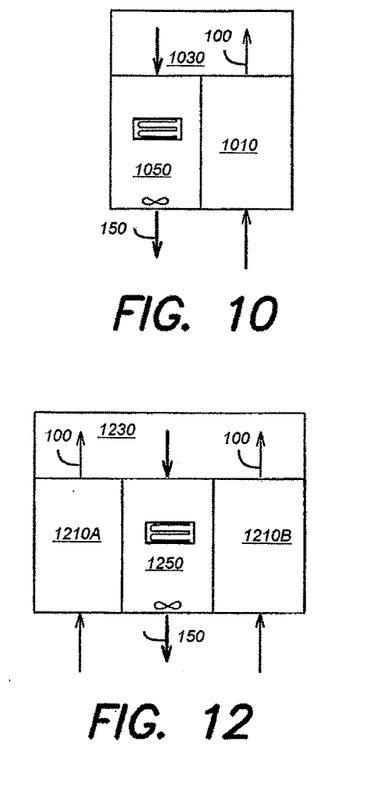
Figures 11, 13:
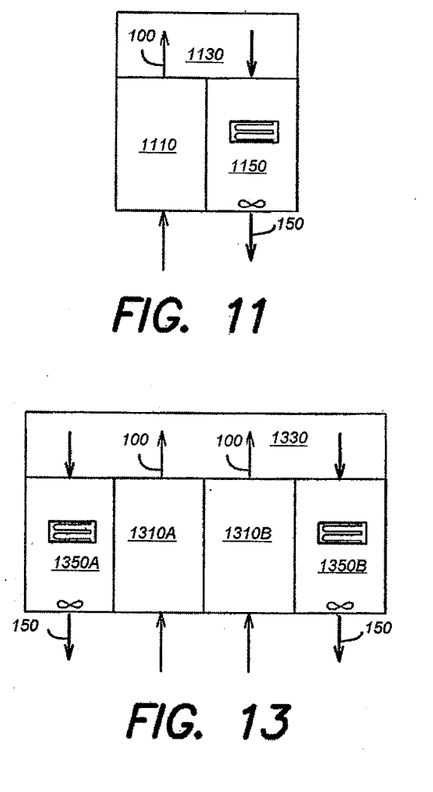
Figure 14:
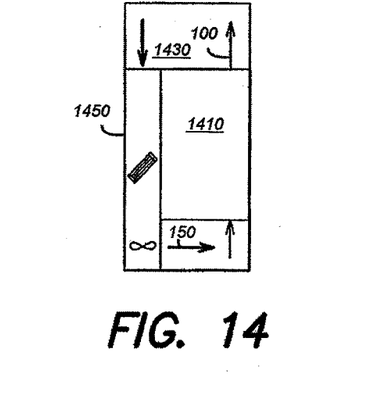

FIGS. 10 and 11 show a full-sized cooling 1050 rack next to an equipment rack 1010 having an air plenum 1030 bridging the racks. FIG. 12 illustrates a cooling rack 1250 disposed between two full-sized equipment racks 1210A, 1210B, and having an air plenum 1230 bridging the racks. The system shown in FIG. 13 has two full-sized cooling racks 1350A, 1350B and two equipment racks 1310A, 1310B arranged in such a manner in a row that the equipment racks 1310A, 1310B are disposed between two cooling racks 1350A, 1350B. The arrangement is such that warm air generated by the equipment racks 100 is drawn into the cooling racks through the air plenum 1330. The cooling racks cool the warm air and deposit the cooled air 150 to the data center. And finally, FIG. 14 illustrates an equipment rack 1410 positioned next to a cooling rack 1450, with the equipment rack 1410 and the cooling rack 1450 being modified to allow cool air 150 to flow from the front of the cooling rack to the front of the equipment rack.

Those of ordinary skill in the art should recognize that the methods involved in a method and system for cooling an electronic equipment rack disclosed herein may be embodied in a computer program product that includes a computer usable medium. For example, such a computer usable medium can include a readable memory device, such as a solid state memory device, a hard drive device, a CD-ROM, a DVD-ROM, or a computer diskette, having stored computer-readable program code segments. The computer readable medium can also include a communications or transmission medium, such as a bus or a communications link, either optical, wired, or wireless, carrying program code segments as digital or analog data signals.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The limits of the disclosure are defined only in the following claims and equivalents thereto.

What is claimed is:

1. An in-row electronic equipment storage system comprising:
   at least one electronic equipment rack, the electronic equipment rack including a housing defining a volume of space adapted to receive electronic equipment, and an electronic equipment rack air cavity, the housing having an opening formed therein;
   at least one cooling rack, the cooling rack including a housing defining a volume of space adapted to receive cooling equipment, and a cooling rack air cavity, where the cooling rack is configured to be disposed adjacent to the electronic equipment rack, the cooling rack air cavity being in fluid communication with the opening of the housing of the at least one equipment rack; and
   at least one interface configured to allow fluid communication between the cooling rack air cavity and the electronic equipment air cavity, the at least one interface including a pocket door panel that is slidable with respect to the housing of the equipment rack so that the panel slides from a first position in which the panel completely blocks the opening to a second position in which the panel is slid out of the way so as to expose the entire opening, the size of the opening being selectively configured by sliding the panel between its first and second positions.

2. The system of claim 1 further comprising:
   at least a second electronic equipment rack including a housing defining a volume of space adapted to receive electronic equipment, and a second electronic equipment rack air cavity, where the second electronic equipment rack is configured to be disposed adjacent to the first electronic equipment rack; and
   at least one electronic rack interface configured to allow fluid communication between the first electronic equipment rack air cavity and the second electronic equipment air cavity.

3. The system of claim 1, wherein the cooling housing includes a side wall having an opening formed therein, the electronic equipment rack housing includes a side wall having the opening formed therein, and the interface includes an arrangement such that the opening on the side wall of the cooling rack corresponds to the opening on the side wall of the electronic equipment rack air.

4. The system of claim 1 further comprising:
a controller configured to control the panel to alter the rate of airflow between the cooling rack air cavity and the electronic equipment air cavity.

5. The system of claim 4 wherein the controller is configured to alter the rate of airflow in response to environmental parameters obtained by the controller.

6. A method of cooling an electronic equipment rack of the type comprising a housing defining a volume of space adapted to receive electronic equipment, the method comprising:
positioning a cooling rack next to the equipment rack, the cooling rack comprising a housing defining a volume of space adapted to receive cooling equipment;
forming an opening in the housing of the equipment rack;
forming an opening in the housing of the cooling rack;
aligning the opening of the equipment rack with the opening of the cooling rack to provide fluid communication between the volume of space of the equipment rack and the volume of space of the cooling rack; and
selectively closing one of the openings of the equipment rack and the cooling rack with a pocket door panel that is slidable with respect to the housing of the equipment rack so that the panel slides from a first position in which the panel completely blocks the opening to a second position in which the panel is slid out of the way so as to expose the entire opening, the size of the opening being selectively configured by sliding the panel between its first and second positions.

7. The method of claim 6 wherein the selectively closing one of the openings is controlled by software.

* * * * *